United States Patent [19]

Wagenmakers

[11] Patent Number: 4,639,620
[45] Date of Patent: Jan. 27, 1987

[54] PARALLEL-SERIES CONVERTER

[75] Inventor: Johannes Wagenmakers, Hilversum, Netherlands

[73] Assignee: U.S. Philips Corporation, New York, N.Y.

[21] Appl. No.: 690,924

[22] Filed: Jan. 11, 1985

[30] Foreign Application Priority Data

Jan. 11, 1984 [NL] Netherlands .................. 8400090

[51] Int. Cl.$^4$ ............................................. H03K 19/08
[52] U.S. Cl. .................................... 307/446; 307/443; 307/243; 307/479; 307/606; 328/56; 328/104
[58] Field of Search ............... 307/260, 479, 606, 243, 307/265, 446, 443; 328/154, 58, 103, 104, 111, 112, 55, 56

[56] References Cited

U.S. PATENT DOCUMENTS 3,168,656  2/1965  Kobbe .................... 307/606
3,226,648 12/1965  Davidson ................ 307/479
3,515,995  6/1970  Belcourt ................. 307/260

Primary Examiner—John S. Heyman
Assistant Examiner—Trong Quang Phan
Attorney, Agent, or Firm—Thomas A. Briody; William J. Streeter; Leroy Eason

[57] ABSTRACT

Parallel-series converter having a plurality of parallel inputs and comprising a combining arrangement having a plurality of inputs equal in number to the plurality of parallel inputs of the parallel-series converter, and a series output, each parallel input being connected via the series arrangement of a terminating impedance and a transmission line to a respective one of the inputs of the combining arrangement, the delay times of the individual transmission lines having respective different magnitudes according to an arithmetical progression, the junction between each terminating impedance and the associated transmission line being connected to a short-circuited transmission line having a length $\lambda/2$, where $\lambda$ is the wavelength of the desired output frequency of the parallel-series converter, each original pulse, as applied to the input of the relevant short-circuited transmission line appearing after a short period of time, with a delay and in inverted form at the same input, such that the original pulse, during the time in which the original pulse, during the time it is overlapped by the inverted pulse, is wholly, or substantially wholly, eliminated.

8 Claims, 2 Drawing Figures

PARALLEL-SERIES CONVERTER

BACKGROUND OF THE INVENTION

1. Field of the Invention

The invention relates to a parallel-series converter having a plurality of parallel inputs and comprising a combining arrangement having a plurality of inputs equal in number to the plurality of parallel inputs of the parallel-series converter, and a series output.

2. Description of the Related Art

In digital transmission systems it often happens that the wish is felt for converting n parallel spatially separated bit streams of p bits/second each, into one serial bit stream, without loss of information. In this serial bit stream the individual n but streams are now separated in time. This procedure is known as the parallel-series conversion, the serial digital signal having a frequency equal to $n \times p$ bits/second.

In digital transmission systems it is normal practice to effect such parallel-series conversion only with the aid of active digital circuits. These active circuits are integrated with further portions of the transmission system on, for example, a semiconductor body. The use of integrated active digital circuits increases the total required dissipation of the semiconductor body. This may cause design problems in connection with the maximum permissible dissipation of the semiconductor body.

SUMMARY OF THE INVENTION

The invention has for its object to provide a solution to the above problem and is characterized in that each parallel input is connected via the series arrangement of a terminating impedance and a transmission line to a respective one of the inputs of the combining arrangement, the time delays of the individual transmission lines having respective different magnitudes according to an arithmetical progression, the junction between each terminating impedance and the associated transmission line being connected to a short-circuited transmission line having a length $\lambda/2$, where $\lambda$ is the wavelength of the desired output frequency of the parallel-series converter, each original pulse as applied to the input of the relevant short-circuited transmission line appearing again after a short period of time with a delay and in inverted form at the same input, such that the original pulse, during the time it is overlapped by the inverted pulse, is wholly or substantially wholly, eliminated.

In a parallel-series converter according to the invention, use is made predominantly of passive elements to effect the parallel-series conversion. As a result, the additional dissipation due to the parallel-series converter and added to the total dissipation is drastically reduced.

BRIEF DESCRIPTION OF THE DRAWING

The invention will now be described in greater detail by way of example with reference to the accompanying drawings, in which.

DESCRIPTION OF THE PREFERRED EMBODIMENT

Figure 1:
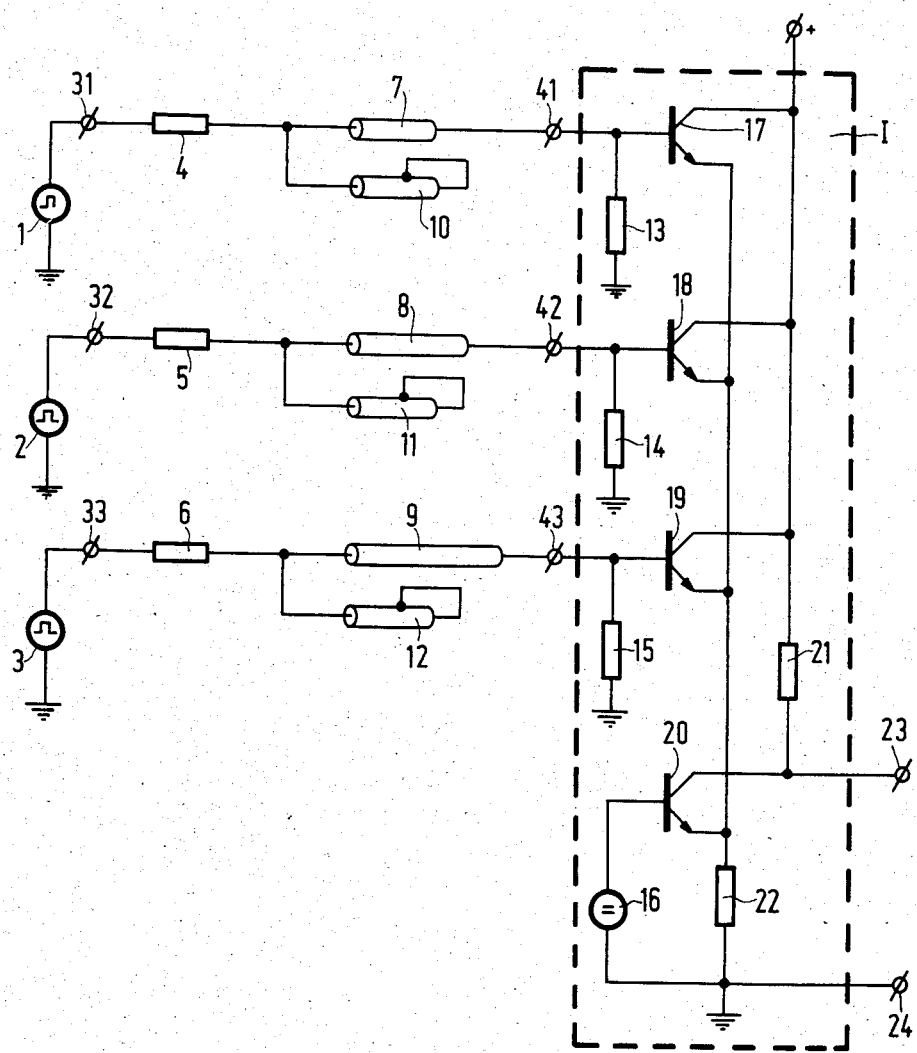
FIG. 1 shows an embodiment of a parallel-series converter according to the invention.

In the parallel-series converter shown in FIG. 1, the parallel inputs are constituted by the terminals 31, 32 and 33 and the information is applied to these terminals by sources 1, 2 and 3. The input 31 is connected to a first input 41 of a combining arrangement I via the series arrangement of a terminating impedance 4 and a transmission line 7. The input 32 is connected to a second input 42 of the combining arrangement I via the series arrangement of a terminating impedance 5 and a transmission line 8. The input 33 is connected to a third input 43 of the combining arrangement I via the series arrangement of a terminating impedance 6 and a transmission line 9. The input 41 is connected to a terminating impedance 13 and also to the base electrode of a transistor 17. The input 42 is connected to a terminating impedance 14 and also to the base electrode of a transistor 18. The input 43 is connected to a terminating impedance 15 and also to the base electrode of a transistor 19. The collectors of the transistors 17, 18 and 19 are connected to the positive pole (+) of a supply voltage and also via a resistor 21 to an output 23 of the parallel-series converter. The collector of a transistor 20 is connected to the output 23 of the parallel-series converter. The emitters of the transistors 17, 18, 29 and 20 are connected in common to a point 24 of constant potential via a resistor 22. The base electrode of the transistor 20 is connected to a source of reference voltage 16. The junction point of the terminating impedance 4 and the transmission line 7 is connected to a short-circuited transmission line 10. The junction of the terminating impedance 5 and the transmission line 8 is connected to a short-circuited transmission line 11. The junction of the terminating impedance 6 and the transmission line 9 is connected to a short-circuited transmission line 12.

Figure 2:
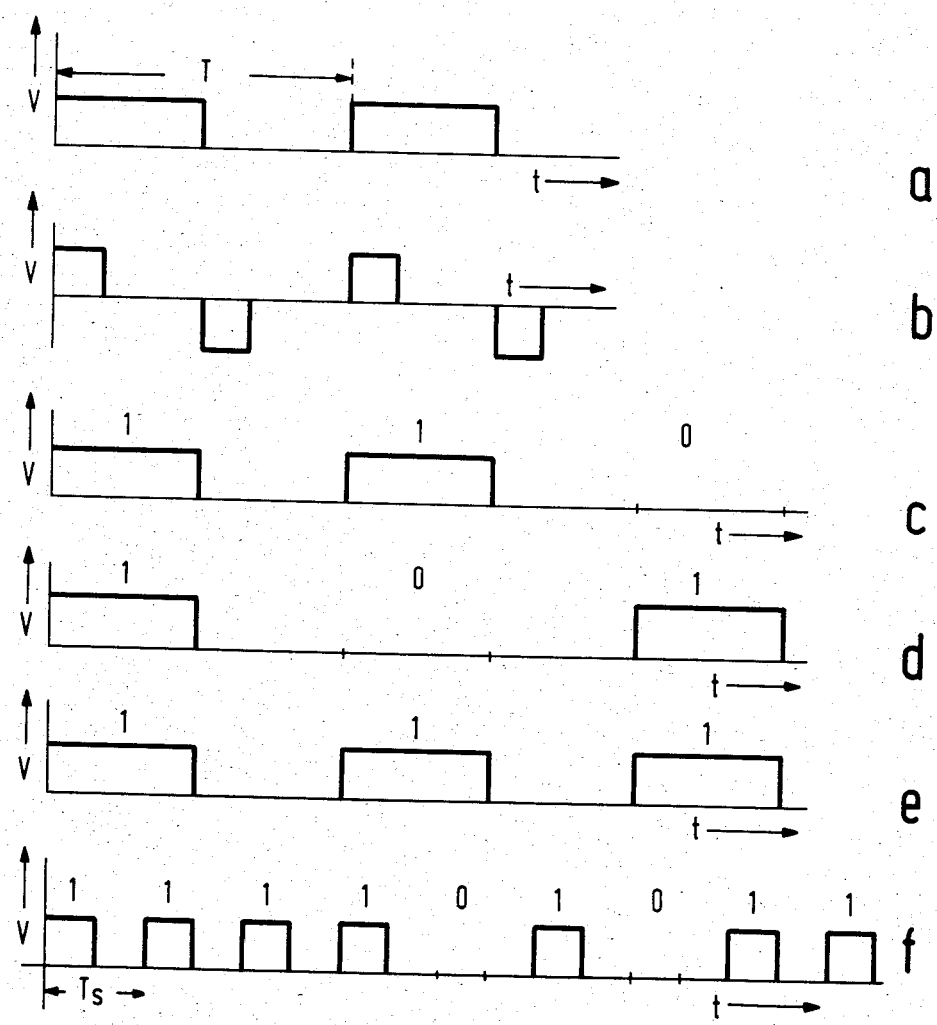
FIG. 2 shows a time diagram to explain the operation of the parallel-series converter.

A digital signal, which is of the shape shown in FIG. 2a, is applied to the inputs of the parallel-series converter. The widths of the pulses applied to the inputs are limited, such as described, for example, in U.S. Pat. No. 3,515,995. This is necessary as otherwise loss of information would occur in the parallel-series converter. In addition, negative reflection pulses are produced at the input of the short-circuited transmission line, as shown in FIG. 2b. These reflection pulses are unwanted and are suppressed in the combining arrangement I with the aid of the transistor 20 and the reference voltage 16 source. Mutatis mutandis it is alternatively possible to utilize the negative pulse and to eliminate the positive pulse. A further method of suppressing the unwanted reflection pulses is, for example, to provide a diode between the short-circuited transmission line 10 and the transmission line 7. This diode is arranged such that only the positive pulses are allowed to pass to the transmission line 7. FIG. 2c shows by way of example a voltage variation of the pulses produced by the source 1. FIG. 2d shows by way of example a voltage variation of pulses produced by the source 2 and FIG. 2e shows the voltage variation of the pulses produced by source 3.

In response thereto, the three parallel bit streams (1, 1, 0), (1, 1, 1) and (0, 1, 1) appear in this succession at the inputs 31, 32 and 33. Due to the action of the respective short-circuited transmission lines 10, 11 and 12, the pulse widths of the pulses from these parallel bit streams are limited as is shown in FIG. 2b. The three parallel bit streams of three bits each are thereafter applied to the inputs 41, 42 and 43 of the combining arrangement I. The transistors 17, 18, 19 and 20 together form a multiple OR-gate. With the aid of the transistors 17, 18 and 19 the three parallel bit streams are arranged time-sequentially as is shown in FIG. 2f. The emitter of the transistor 20 is adjusted to such a potential with the aid of the reference voltage source 16 that the above-mentioned negative reflection pulses as shown in FIG. 2b are blocked and do not occur at the output 23 of the parallel-series converter. The repetition rate $T_s$ of the serial pulses at the output 23 is equal to $\frac{1}{3}$ T, where T is the repetition rate of the pulses at the inputs 31, 32 and 33 of the parallel-series converter. The time delays $\tau$ of the transmission lines 7, 8 and 9 are adjusted such that the pulses of limited widths which are obtained, appear one after the other at the respective inputs 41, 42 and 43. A possible choice of these time delays is, for example, $\tau(7)=0$, $\tau(8)=T_s$ and $\tau(9)=2T_s$, see FIG. 2f. These transmission lines can be realized, depending on the frequency range in which the digital transmission system is operated, with the aid of printed conductors, cables, microstrips etc.

What is claimed is:

1. In a parallel-series converter having a plurality of parallel data signal inputs, a series data signal output, and a combining arrangement having a plurality of inputs equal in number to said plurality of data signal inputs, the improvement characterized in that:

each of the parallel data signal inputs is respectively connected by a series arrangement of a terminating impedance and a transmission line to respective ones of the inputs of said combining arrangement, the time delays of the respective transmission lines having different magnitudes according to an arithmetical progression; and the junction between each terminating impedance and the associated transmission line is connected to a short-circuited transmission line having a length $\lambda/2$, where $\lambda$ is the wavelength of the data signal output of said converter;

whereby each pulse in an input data signal reaching any such junction is reflected back to such junction by the short-circuited transmission line connected thereto in inverted form and after a time delay such that it substantially wholly cancels the portion of the original pulse which is overlapped by the inverted pulse.

2. A parallel-series converter as claimed in claim 1, wherein the inputs of said combining arrangement are respectively connected to the bases of respective transistors, the collectors of said transistors being interconnected and the emitters of said transistors also being interconnected, the junction of the collectors being connected to one terminal of a source of supply voltage and being further connected by an impedance to the output of said converter, and the junction of the emitters being connected to another terminal of said source of supply voltage by a further impedance; and said converter comprises a further transistor having a collector connected to the data signal output of said converter, an emitter connected to the junction of the emitters of the aforesaid transistors, and a base connected to a source of reference voltage;

whereby the non-cancelled portions of the pulses in the input data signals appear, separated in time, at said junction of the collectors of the aforesaid transistors, and the reference voltage establishes a threshold voltage level at the data signal output of said converter such that only non-cancelled portions of pulses in the data signal inputs are produced in the data signal output.

3. In a parallel-series converter having a plurality of parallel inputs receiving pulses having an excessive pulse width for serial transmission at a desired output frequency, a combining arrangement having a plurality of combining inputs equal in number to said plurality of parallel inputs, and a series output for furnishing output signals at said desired output frequency; apparatus for decreasing said excessive pulse width, comprising:

a plurality of connecting means, each for connecting one of said parallel inputs to a corresponding one of said combining inputs, each of said connecting means comprising a terminating impedance and a transmission line connected to said terminating impedance at a junction, the time delay of each of said transmission lines having a magnitude different from the magnitude of the time delay of all others of said transmission lines, said magnitudes varying in accordance with an arithmetic progression;

and a short-circuited transmission line having a length equal to a predetermined fraction of the wavelength corresponding to said desired output frequency connected to each of said junctions, whereby reflection of a received pulse by one of said transmission lines creates a reflected pulse having substantially the same magnitude but of opposite polarity to said received pulse such that portions of said received pulse coinciding with said reflected pulse are cancelled.

4. A parallel-series converter as set forth in claim 3, wherein said combining arrangement comprises an OR gate having a plurality of inputs constituted by said combining inputs and an output constituted by said series output.

5. A parallel-series converter as set forth in claim 4, wherein said OR gate comprises a plurality of transistors each having a base connected to a corresponding one of said combining inputs, each further having a collector and an emitter respectively connected in common with the others of said emitters and collectors, and means connecting the so-connected collectors to said series output.

6. A parallel-series converter as set forth in claim 3, further comprising a terminating resistor for each of said transmission lines connected from a corresponding one of said combining inputs to reference potential.

7. A parallel-series converter as set forth in claim 3, wherein a pulse of opposite polarity to said received pulses is created by portions of said reflected pulse not overlapping said received pulse;

further comprising means for cancelling said opposite polarity pulse.

8. A parallel-series converter as set forth in claim 7, wherein said means for cancelling said reflected pulse comprises a transistor having an emitter-collector circuit connected to said output terminal, and additional circuit means connected to said transistor for creating a threshold voltage at said output terminal, said threshold voltage suppressing said reflected pulse.

* * * * *